United States Patent [19]

Knauer

[11] Patent Number: 4,634,871
[45] Date of Patent: Jan. 6, 1987

[54] METHOD AND APPARATUS FOR SPOT SHAPING AND BLANKING A FOCUSED BEAM

[75] Inventor: Wolfgang Knauer, Malibu, Calif.

[73] Assignee: Hughes Aircraft Company, Los Angeles, Calif.

[21] Appl. No.: 691,255

[22] Filed: Jan. 14, 1985

[51] Int. Cl.[4] .............................. H01J 3/14; H01J 3/26
[52] U.S. Cl. ................................... 250/398; 250/492.2
[58] Field of Search ............................. 250/492.2, 398; 313/360.1, 361.1; 219/126 EB, 121 EM

[56] References Cited

U.S. PATENT DOCUMENTS

| 4,151,422 | 4/1979 | Goto et al. | 250/492.2 |
| 4,182,958 | 1/1980 | Goto et al. | 250/492.2 |
| 4,243,866 | 1/1981 | Pfeiffer et al. | 250/492.2 |
| 4,393,312 | 7/1983 | Collier et al. | 250/492.2 |

Primary Examiner—Bruce C. Anderson
Attorney, Agent, or Firm—Wanda K. Denson-Low; A. W. Karambelas

[57] ABSTRACT

Charged particle source (14) delivers beam (20) which is collimated onto first aperture plate having first aperture (28). The beam passing therethrough is deflected by deflection plates (32, 34, 38 and 40) with respect to second aperture (46) in second aperture plate (44). The image (50) of the second aperture (46) is focused on the target plane (16) and the projected image of the footprint (58) of the deflected beam is focused on the target plane (16). When these images overlap, a shaped beam (56) passes through. Scanning of the beam across the target plane by deflection plates (52 and 54) permits exposure of sharp-edged features (62) by positioning the image (60a) inside the margin (64) and then scanning the image (50b) thereacross to expose the sharp edge and thereupon picking up the image (60) so that they both scan across the feature to be exposed.

16 Claims, 14 Drawing Figures

METHOD AND APPARATUS FOR SPOT SHAPING AND BLANKING A FOCUSED BEAM

BACKGROUND OF THE INVENTION

This invention is directed to a method and apparatus by which a charged particle beam of electron or ions is focused, spot-shaped and blanked so as to permit high-speed writing of the beam in a desired pattern on a target.

Electron and ion beams are used to expose lithographically sensitive resist material on a semiconductive wafer so that after removal of the non-masking portions of the resist, the wafer can be doped or etched. As beam spot resolution improves, finer lines can be drawn, with closer spacing, but such small spots require considerable time to expose large areas. The writing speed of conventional electron beam lithography systems in which the demagnified image of a thermionic electron source serves as the writing space is inadequate for submicron circuit fabrication purposes.

An alternative approach to submicron electron and ion beam lithography is to use shaped spots. Several investigators have shown that variable shaped spots with good edge resolution can increase the writing speed potential dramatically, as outlined in the following papers: M. G. R. Thomson, R. J. Collier, and D. R. Herriott, *Journal of Vacuum Science Technology* 15, 891 (1978); and H. C. Pfeiffer *Journal of Vacuum Science Technology* 15, 887 (1978). In fact, for minimum feature sizes of 1-2 microns, this approach has been proven in an actual production environment (see: G. J. Guiffre, J. F. Marquis, H. C. Pfeiffer, W. Stickel, 15th Symposium on Electron, Ion and Photon Beam Technology, Boston (1979).

As the beam sweeps over the area to be exposed, it is blanked at the boundaries of the area. When the beam is a spot image of the source or is a shaped beam with the blanking done above the shaping aperture, even with fast blanking there is a margin of the exposure area where the exposure is washed out. The exposure is not sharply cut off at the edge of the feature to be exposed, even with fast blanking. To produce sharp exposure boundaries, the shaped writing spot must be moved in steps. The writing spot remains in each area until exposure is achieved and then is shifted to the adjacent area. When the edge of the feature to be exposed is reached, the writing spot provides full exposure to the edge of the feature, and then fast blanking stops the exposure. This method defines the feature to be exposed with fairly sharp edges to the exposure. However, stepping of the spot results in inefficient time utilization and in excessive band width needs for the beam deflection system.

Therefore, there is need for a method and apparatus for spot-shaping and blanking a focused beam which permits sweeping of the beam to minimize exposure time and needed deflection bandwith and yet provides an accurate and sharp edge definition of the feature to be exposed so that exposure can be readily and economically mechanized and programmed to provide rapid exposure.

SUMMARY OF THE INVENTION

In order to aid in the understanding of this invention, it can be stated in essentially summary form that it is directed to a method and apparatus for spotshaping and blanking a focused beam. The apparatus has two serial apertures, and beam steering permits the images of these apertures at the target plane to relatively move from an overlapped to a nonoverlapped position. When not overlapped, the beam is blanked. In addition, the shaped beam can be steered so that it can be continuously swept beyond the outlines of the feature to be exposed, and the beam is blanked and unblanked at the edges of the feature by synchronously shifting the images of the apertures to provide a sharp edged exposure.

It is, thus, a purpose and advantage of this invention to provide a focused beam apparatus which employs a charged particle source and through a simple optical system projects the image of two apertures on the target, with beam steering so that when the images overlap, the beam passes through to the target and when the images are shifted apart the beam is blanked.

It is another purpose and advantage to provide a method and apparatus for spot-shaping and blanking a focus beam wherein the focused beam is swept across a feature to be exposed and the beam is unblanked and in such a manner as to provide sharp exposure boundaries defining the edge of the feature being exposed.

Other purposes and advantages of this invention will become apparent from a study of the following portions of the specification, the claims and the attached drawings.

DETAILED DESCRIPTION OF THE INVENTION

Figure 1:
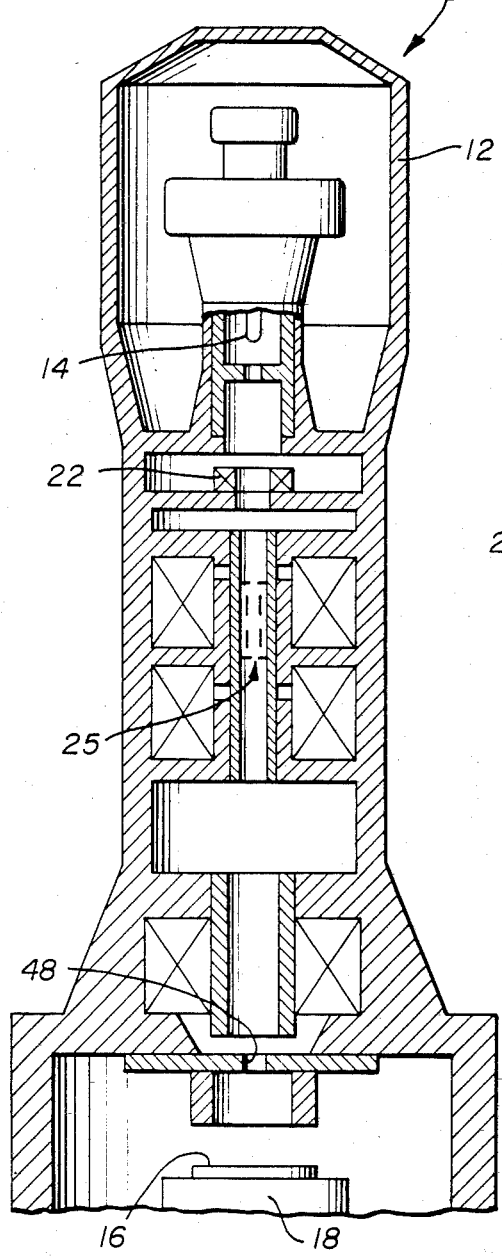
FIG. 1 is a generally central longitudinal section through a charged particle beam column having the spot shaping and blanking devices in accordance with this invention.
Figure 2:
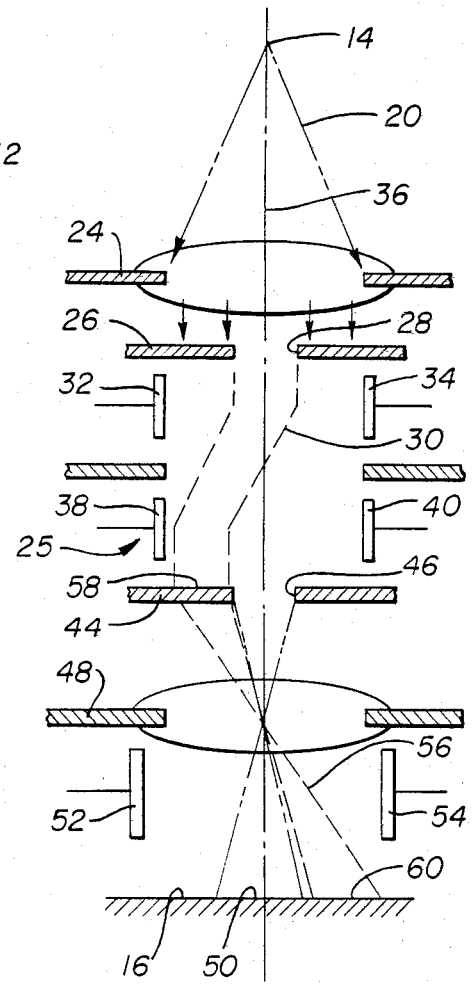
FIG. 2 is a ray trace of the beam optical structural of the apparatus, showing one example of the position of the images on the target.

When the charged particle beam comprises electrons, the preferred embodiment of the beam apparatus of this invention is generally indicated at 10 in FIG. 1. The apparatus includes a housing 12 within which a sufficient vacuum is drawn to permit beam management. The hot filament electron source is a tungsten hairpin filament which is biased with respect to target wafer 16 on target stage 18 at 20 kilovolts so that the tungsten hairpin filament source generates a beam with a brightness of about $3 \times 10^5$ amperes per square centimeter and steradian, and with a virtual source diameter at crossover of approximately 50 microns. The electron beam is indicated at 20 in FIG. 2. Magnetic beam alignment coils 22 are part of the first lens and aperture 24 which collimates the beam. The lens and aperture combination is schematically shown in FIG. 2. The beam floods first aperture plate 26 and illuminates the first aperture 28 therein. The portion of the electron beam 20 which passes through aperture 28 is shaped by that aperture to become the first aperture shaped beam 30. The first pair of deflection plates 32 and 34 deflect the shaped beam 30 away from the center axis 36 of the apparatus. Second pair of deflection plates 38 and 40 redirect the shaped beam 30 so that it is essentially parallel to the axis 36. It is appreciated that in addition to the deflection plate shown for left and right deflection of the beam 30 in FIG. 2, there are also deflection plates at right angles thereto for deflecting the beam 30 toward and away from the plane of the paper normal to the deflection direction of the first and second pairs of deflection plates.

Beam 30, thus, approaches second aperture plate 44 which has second aperture 46 therein. The image of the first and second apertures 28 and 46 are focused onto the target 16 by third lens 48. On the target these images are seen as aperture images 50 and 60, respectively. Scan deflection plates 52 and 54 can scan the shaped beam 56 on the target. Again, there are deflection plates at right angles to the deflection plates 52 to 54 so that the image of the beam can be scanned over a selected area of the target. In FIG. 2, the image 50 of the second aperture 46 is on the center line for the purposes of illustration.

The beam 30 is scanned with respect to aperture 46, and in the position shown in FIG. 2, the beam footprint 58 is on second aperture plate 44 away from the aperture 46. When considering the effect of lens 48 and deflection plates 52 and 54, the projected image 60 on the target 16 is seen not to overlap the image 50, and, therefore, there is no beam on the target. Projected image 60 is the beam image that would appear at the target plane in the absence of aperture plate 44; image 50 is the beam image at the target plane when the beam is not deflected by deflection plates 32, 34, 38 and 40, but rather continues in a straight line along axis 36 through aperture 46. However, when the two images overlap, then the beam strikes the target in the overlapping area. This is a convenient way to visualize the effects of scanning the footprint 58 with respect to aperture 46. It will be appreciated that the overlapping portion of the images 50 and 60 can be scanned both left-to-right and front-to-back in FIG. 2.

Figure 3:
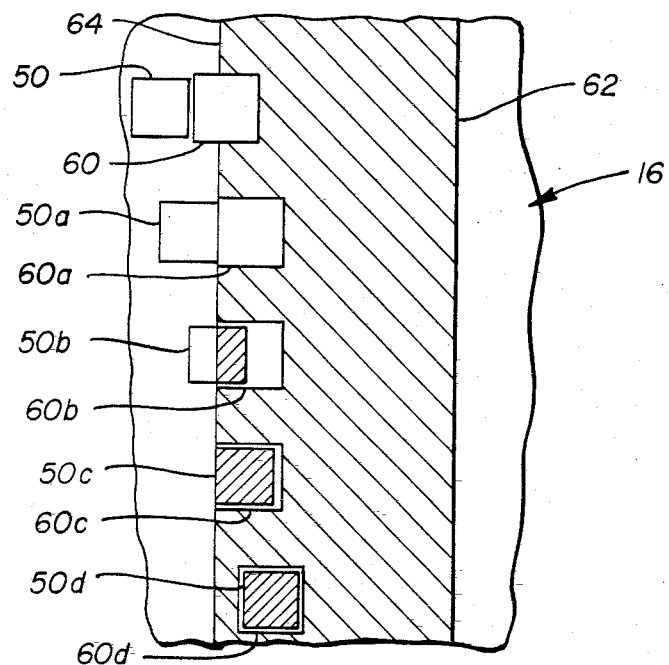
FIG. 3 is a plan view of a feature to be exposed on the target showing the path of the images, to achieve blanking and sweep exposure on the target of the charged particle beam.

With this mobility and this structure for scanning the images in mind, the function of spot-shaping and blanking can be appreciated with respect to the progressive showing in FIG. 3. Target wafer 16 has a feature 62 to be exposed. The images 50 and 60 are shown as footprints on the target wafer. The second aperture image 50 is illustrated as being square and slightly smaller than the projected image 60 of the footprint of the upper aperture at the lower aperture plate. Square is a convenient shape, but it is merely illustrative. In exposing the feature 62, the beam is initially blanked and directed to a location which is slightly to the left of the feature 62. The projected image 60 is shifted to a position ahead of the lower aperture image 50 and is stopped on the inside margin of the feature at position 60a. The beam 50 continues sweeping to the right and reaches the margin at position 50a. Continued sweeping of the beam 50 moves it to a position 50b where it overlaps the image 60b exactly on the margin 64. The exposed area opens like a focal plane shutter. The sweep of beam 50 continues to position 50c where full overlap occurs. Thereupon, the sweep of image 50 continues and the sweep of image 60 starts to the right to remain overlapped with the image 50 so that the overlapped area represents the beam footprint which is swept across the feature 62. The images sweep across the feature 62 in the fully overlapped position until they reach the right margin of the feature 62. Thereupon, the image 60 of the upper aperture is stopped against the inside of the right margin of the feature 62 while the image 50 of the lower aperture continues sweeping. Despite the sweeping of the image of the lower aperture, since the image of the upper aperture is stopped at the margin, the beam is blanked as it reaches the margin.

Figure 4:
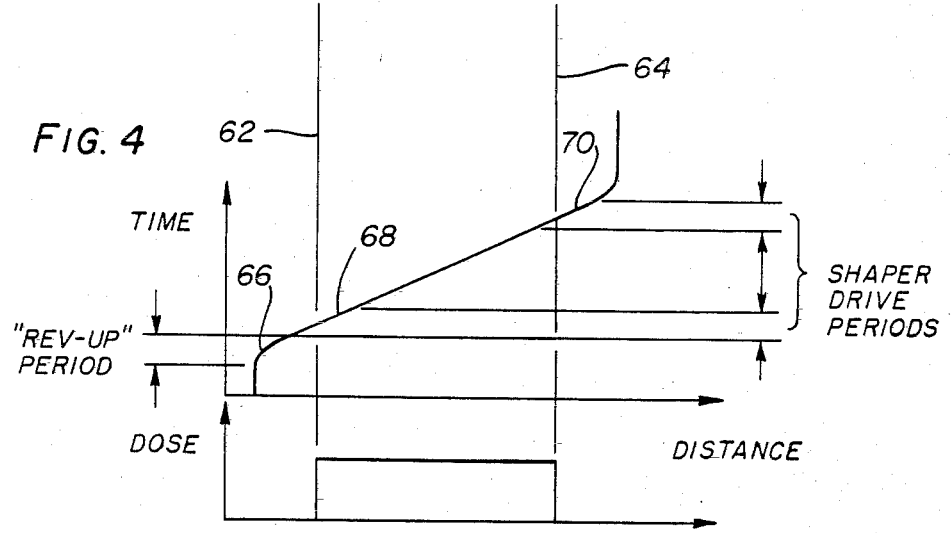
FIG. 4 is a graph of the time and dose versus distance across the feature to be exposed on the target, as achieved by the exposure method illustrated in FIG. 3.

From this description, it can be seen that the two beam images are swept together, except for the margins. Thus, the scan deflection plates 52 and 54 provide the principal scan across the target, and the plates 32, 34, 38 and 40 control the footprint 58 on the second aperture plate 44 with respect to its aperture 46. Thus, the deflection plates 32, 34, 38 and 40 are drivers which provide the blanking and shaping of the beam. FIG. 4 is a graph of time and dose versus distance across the feature 62. Curve 66 shows the drive for the principal sweeping control of the image of aperture 46. It provides for a beam startup period, a linear scan across the feature to be exposed, and a curved beam deceleration portion. Provision for startup and shutdown of the shaper drive is made by second aperture image 50 being dimensioned slightly smaller than first aperture image 60. The shaper drive is only active during short periods 68 and 70 while the scan crosses the feature margins 62 and 64. Inside of those margins, the images move together overlapped; and outside of those margins, the images move together shifted against each other. In the lower portion of FIG. 4, it is shown that this control of the images provides a square-shaped dosage profile, with sharp cutoffs at the margins of the feature to be exposed.

Figure 5:
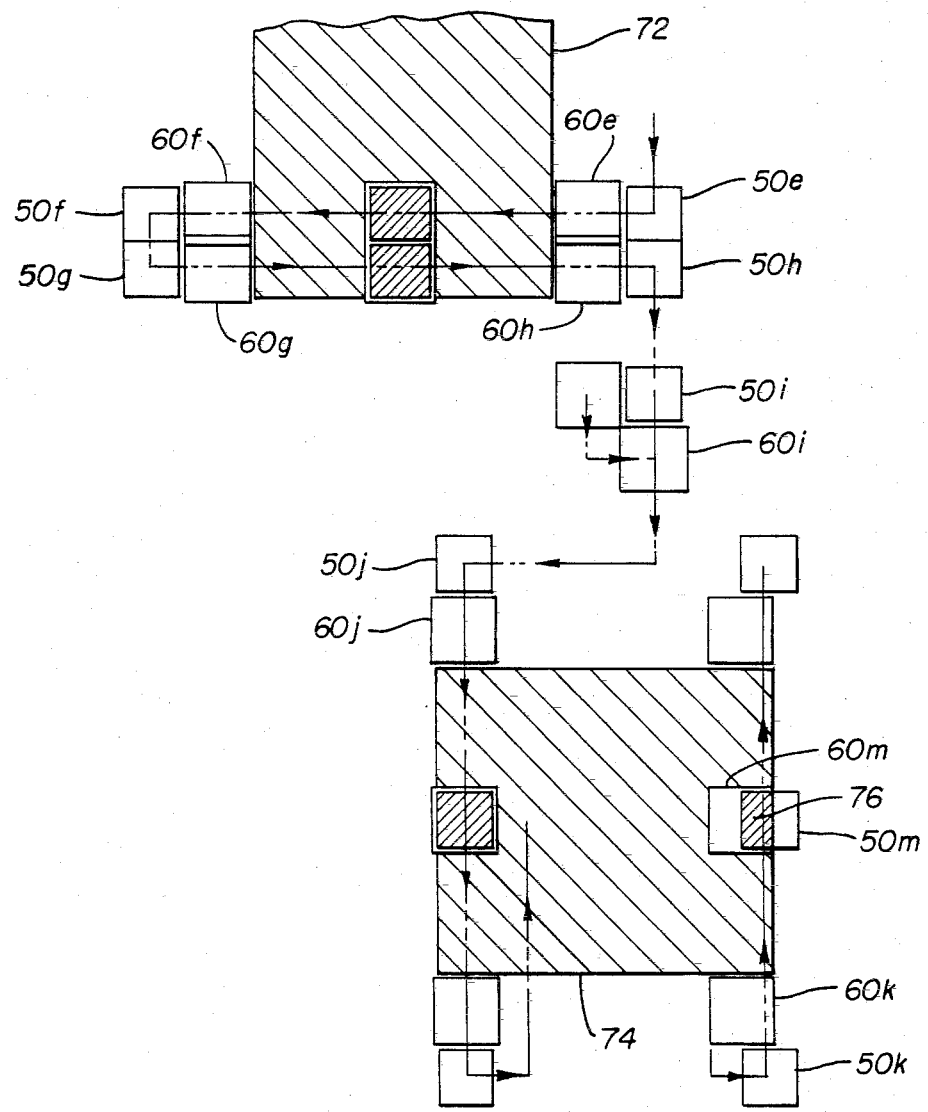
FIG. 5 is a plan view of the target showing another exposure feature to be exposed thereon and showing the manner in which the images are driven to achieve the exposure.

FIG. 5 illustrates the progressive movement of the images to expose the features which are to be exposed, with sharp margins. FIG. 5 illustrates features 72 and 74 to be exposed on a target which carries both of the features. As described with respect to FIG. 3, the two images 50 and 60 are brought into position at the edge of feature 72 with the image 60 moving in first from the position 60e to a position just inside the margin. Image 50 is swept across the feature 70 from the position 50e to a point where it fully overlaps image 60, and then the two images are swept together so that the beam footprint sweeps across the feature 72. On the inside of the far margin of the feature 72, image 60 stops while image 50 sweeps out past the far edge of the feature to position 50f. Thereupon, image 60 is moved out to position 60f and both images are stepped downward to positions 50g and 60g. Image 60g is moved inside the left margin or the feature, and image 50g is swept across the feature picking up image 60 on its way and dropping it off on the inside of the right margin. Image 50 continues to position 50h, and, thereupon, the image 60 is moved outside the margin to position 60h.

Feature 74 will be swept from top to bottom, instead of from left to right as was feature 72. Therefore, the orientation of the images must be changed because the image 60 first moves into the feature, and the image 50 sweeps all the way across it. The image 50 is moved to the position 50i, and the image 60 is moved from a position beside it to a position 60i in front of it in terms of the up-and-down sweep of the feature 74. The images are then moved to the positions 50j and 60j and are swept up and down across the feature 74, stepping from the left margin toward the right margin. A problem arises when the left-to-right dimension of the feature 74 is not a whole number of widths of the images. Overlapping of the beam scans is not acceptable because an overdosage of exposure occurs on the overlap of beam sweeps. In accordance with this invention, the images 50 and 60 are offset to shape the beam to provide a beam footprint which exactly matches the remaining space on the feature 74 to be exposed. To expose this small remainder area, image 60 is aligned with its right edge even with the right margin of the feature 74, as shown at 60k in FIG. 5. Image 50k is moved to the right so that its left edge is in line with the right edge of its last sweep up and down across feature 74. Next, image 60k is moved inside the lower margin so that its bottom edge aligns with the lower margin and, thereupon, beam 50 is swept upward picking up image 60 when they are fully overlapped in the up-and-down direction. They pass through positions 50m and 60m where the rectangular footprint 76 of the beam extends exactly from the right margin of feature 74 to the last up-and-down exposure of the footprint to the left of footprint 76. The images are swept upward out of the feature and terminate exposure at the top edge in the manner previously described.

Figure 6:
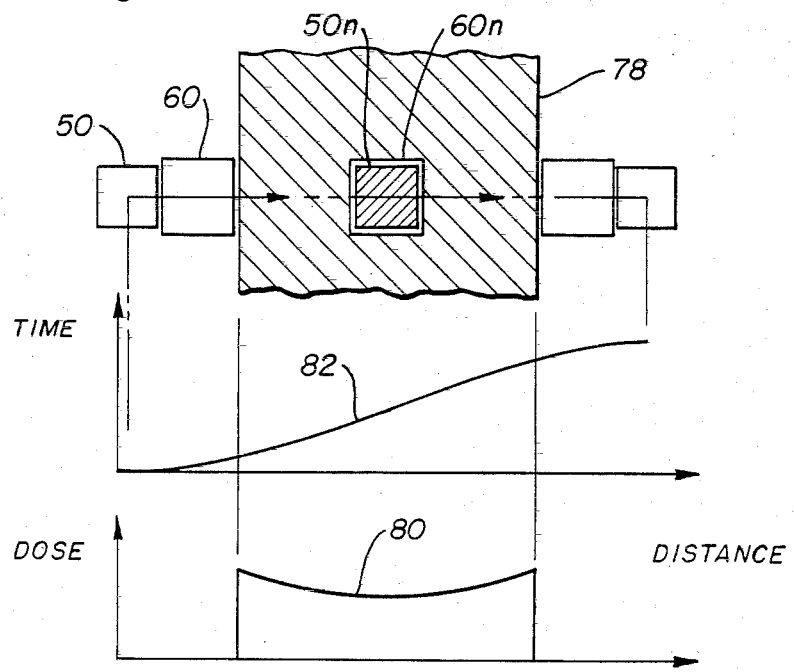
FIG. 6 is a plan view of a feature to be exposed on the target together with a graph of time and dose versus distance for obtaining variable exposure through variable sweep speed.
Figure 7:
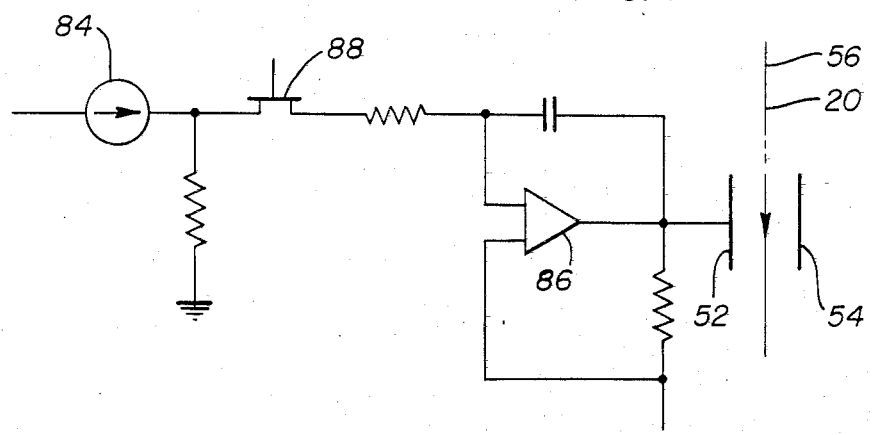
FIG. 7 is a schematic electrical diagram showing a modified sweep driver circuit to achieve the variable sweep speed illustrated in FIG. 6.

Sometimes it is desirable to change the exposure in different areas of the feature. In FIG. 6, feature 78 is to be exposed as indicated by curve 80 in the lower part of the figure. This reduced exposure is accomplished by increased spot speed through the center of the feature, as indicated in the time versus distance curve 82. The images 60 and 50 are managed in the same way, with the image 60 placed inside the left margin and the image 50 swept all the way across picking up the image 60 on the way to fully overlap, as shown at positions 60n and 50n. This is accomplished by the circuitry illustrated in FIG. 7. Constant current source 84 normally drives amplifier 86 to provide a straightline ramp voltage across the deflection plates 52 and 54 for uniform scan speed. In this case, however, FET 88 is connected to control the current to amplifier 86 to increase the deflection speed at the center of the feature.

Figure 8:
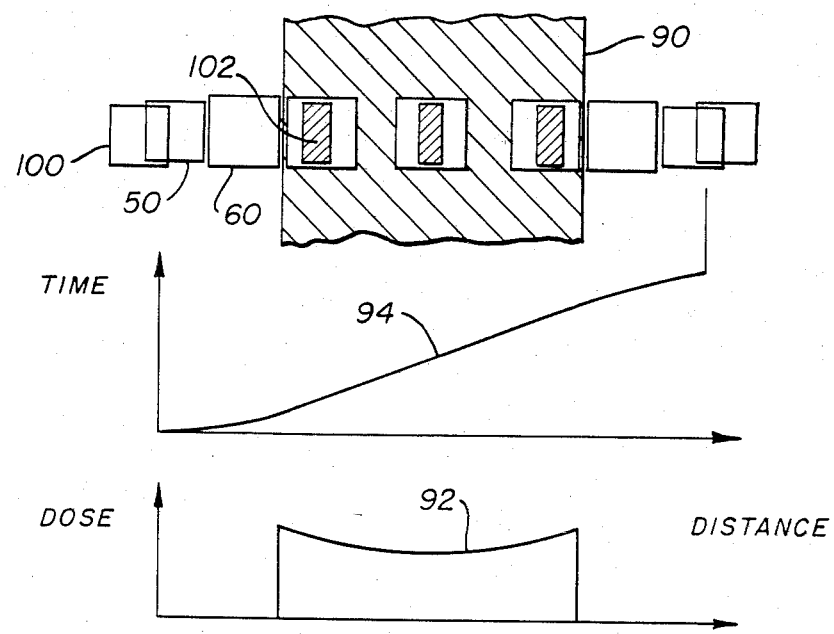
FIG. 8 is a plan view of a target showing a feature to be exposed thereon, together with graphs of time and dose versus distance showing variable exposure across the feature by control of the overlap of the images of three apertures.
Figure 9:
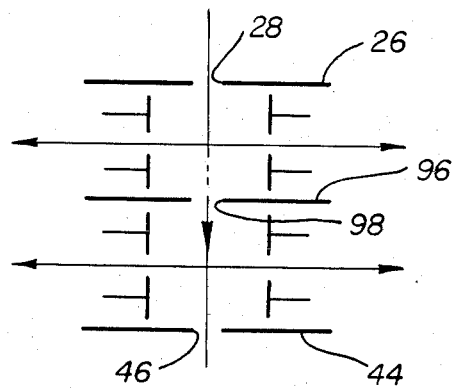
FIG. 9 is a schematic diagram showing a 3-aperture system wherein the change in aperture setting for variable exposure as shown in FIG. 8 can be dynamically accomplished.

Another way of accomplishing the variable dose is illustrated in FIG. 8 wherein feature 90 is to be variably exposed across the left-to-right width of the sweep. The dose versus distance is given by curve 92 in the lower part of the figure, and the constant sweep speed is illustrated by curve 94. In this case, the beam is shaped by three apertures. As is seen in FIG. 9, aperture plates 26 and 44 respectively carry apertures 28 and 46 to produce the images 60 and 50 as previously described. However, in addition, aperture plate 96 with its aperture 98 provides a third aperture image 100, see FIG. 8. When the images 50 and 100 are overlapped, they are together scanned across the feature 90 and pick up the image 60 as they scan across the beginning margin, they present a variable width beam footprint 102 across the feature 90. The width of the footprint is controlled by the overlap of the images 50 and 100. For this dynamically variable spot width, the third aperture is necessary since two apertures would generate end point overexposure, if used with a reduced spot width.

Figure 10:
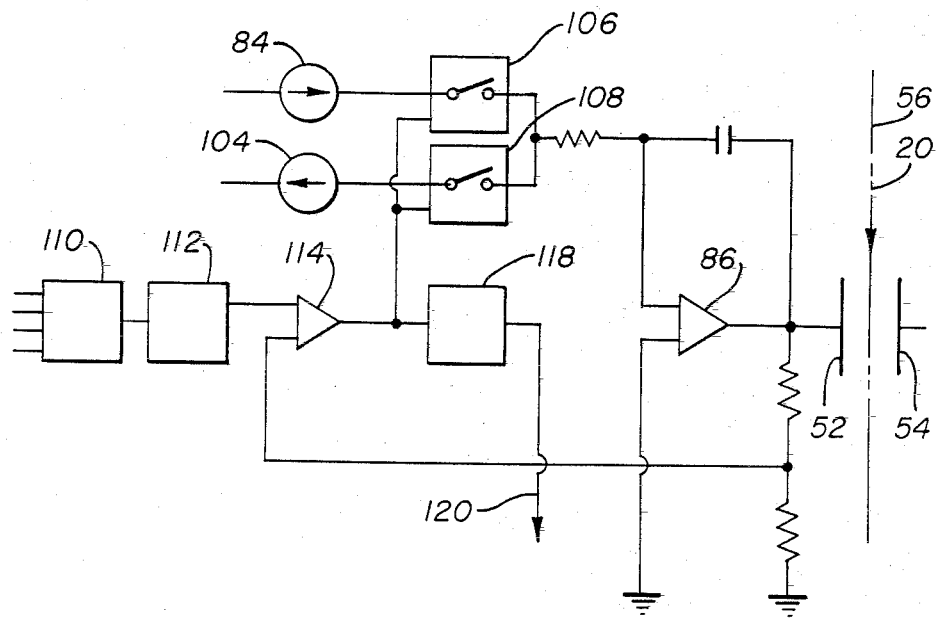
FIG. 10 is an electrical diagram which is partly block diagram and partly schematic showing the drive electronics to control the spot sweep.
Figure 11:
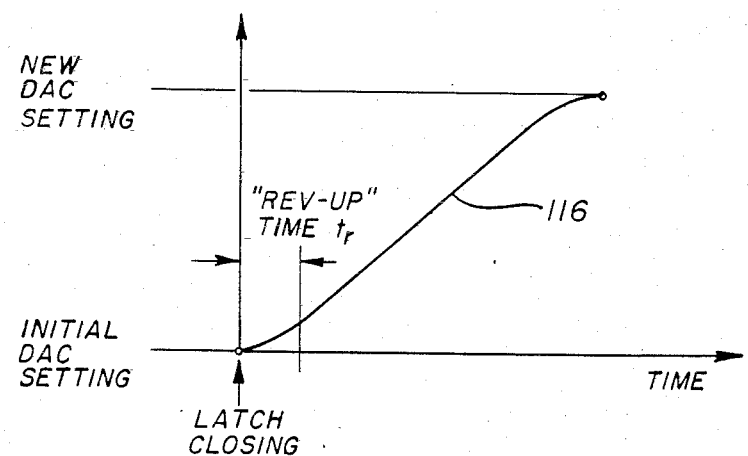
FIG. 11 is a graph showing beam position versus time for a single sweep across the feature to be exposed.

FIG. 10 is a schematic electrical diagram showing an example of circuitry which can achieve the precise beam sweep which is required. A slow and accurate major deflection system which is not shown deflects the beam to a subfield. At the subfield, the fast, minor deflection system of FIG. 10 places the spot adjacent to the feature and sweeps it across the feature. Constant current sources 84 and 104 are provided with switches 106 and 108 for their respective connection to drive the amplifier 86 which, in turn, is connected to the plates for deflection of the beam. This is similar to the circuitry shown in FIG. 7, but illustrates the selective connection of opposite current sources for opposite ramp generation and opposite sweep. Drive amplifier controller 110 is a digital computer which carries a program which commands the sweeps for exposure of the various features. The beam sweep is initiated by setting the controller to the end point address and setting the latch 112. The resultant signal actuates preamplifier 114 which closes the selected switch 106 or 108. This connects the selected constant current source to the drive amplifier 86. The output of drive amplifier 86 change is linear with time and, thus, provides the required linear sweep. At the end point, a feedback signal disconnects the selected constant current source and the spot becomes stationary. A new end point address is then generated by the drive amplifier control 110. The result is a linear sweep, as shown by curve 116 in FIG. 11.

The major feasibility factors for this system involve the necessary band width and the precision of timing. The band width requirements for the beam scanning system are reasonably low since prior to a sweep, the spot can be placed some distance from the exposure boundary. This provides time for the spot to gather speed. For example, in a lithography system With $2.10^{-7}$ seconds exposure time, a time delay of $2.10^{-7}$ seconds to reach proper spot speed is acceptable. Therefore, the beam scanning band width requirement is about 5 megahertz. The spot shaping band width requirement is comparably low, since the second aperture image is smaller than the first aperture image. Therefore, the second aperture image has time to gather speed. On the other hand, timing precision for the start of movement of the two images with respect to each other must be quite small. With a beam sweep speed of $10^3$ centimeter/second, exposure boundary placement to within 500 Angstroms requires a timing precision of nanoseconds. This is within the capability of modern circuits.

The signal from preamplifier 114 is also connected to time delay 118 which provides a signal through line 120 to the spot shaper drive which controls the deflection plates which control the position of footprint 58.

Figure 12:
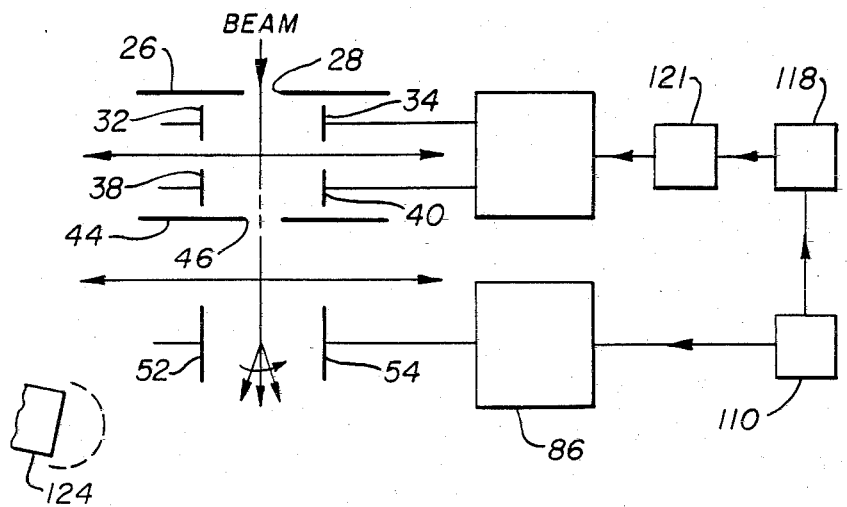
FIG. 12 shows a schematic diagram for the overlapping control of the images in connection with the beam sweeping drive.
Figure 13:
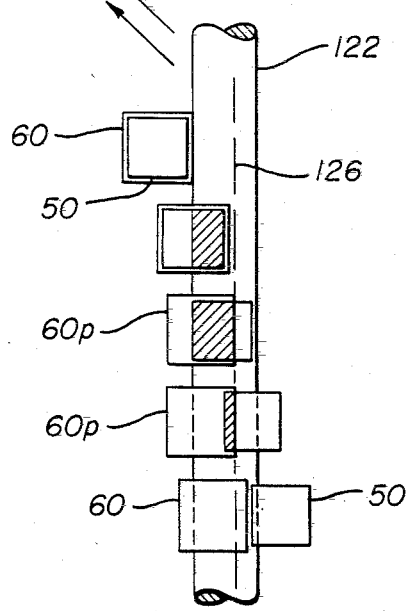
FIG. 13 is a plan view of the images as they are swept onto a target test wire.
Figure 14:
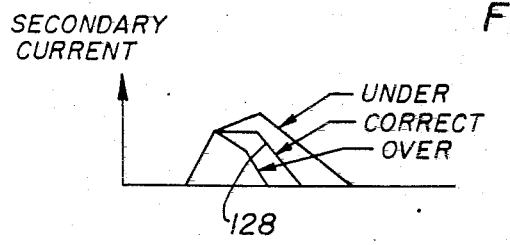
FIG. 14 shows the results of the blanking as accomplished on the test wire.

FIGS. 12, 13 and 14 show the apparatus and result by which the method and apparatus for spot-shaping and blanking of a focus beam in accordance with this invention was built and tested. The structure of FIG. 12 is similar to the structure of FIGS. 2, 7 and 10. Drive amplifier controller 110 drives the principal deflection plates 52 and 54 through amplifier 86 and drives the spot-shaping and blanking control plates 32, 34, 38 and 40, time delay 118 and ramp generator 120. In this case, drive amplifier controller is a scan generator.

Target 122 is a wire with a secondary electron detector 124 positioned adjacent thereto. As the images 60 and 50 were scanned across the target wire, image 60 was stopped at line 122 which defined the right margin of the exposure. This is position 60p with the image maintained in position against the exposure area margin line 26 until the image 50 passes out of overlap. Thereupon, the image 60 is also swept to the right past the margin, as previously described. The correct secondary electron current for square-edge exposures is shown by graph line 128 in FIG. 14 and is compared with situations in which the speed and placement of the two images has not been properly coordinated. The ramp-shaped sides of the correct exposure line 28 are due to the fact that the secondary electron current represents the overlapped beam footprint area on the target, rather than the current on opposite sides of the margin.

High resolution and high-speed resist exposures are achieved by this method and apparatus. Simplicity for the drive electronics is achieved by elimination of of the blanker and its drive electronics. Thus, reasonable band width is achieved for the drive electronics since the working spot moves continuously rather than in periodic steps. The reduced band width requirement can be, if desired, translated into throughput. Exposure gradients at the exposure boundaries are avoided by synchronization between aperture shifting and beam sweep. By shifting the images of the apertures against each other with a speed which, as seen in the target plane, equals the beam sweep speed, the image of the upper aperture in the target plane is made to stand still. This results in constant exposure dose within the exposed area and sharp exposure boundaries, as described above.

This invention has been described in its presently contemplated best mode, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. An apparatus for scanning a focused beam across a target to expose a feature on the target, comprising:
   a charged particle source for producing a beam of charged particle;
   a first aperture plate in the beam path, said first aperture plate having a first aperture therein to produce a shaped beam;
   a second aperture plate serially along the beam path, said second aperture plate having a second aperture therein defined by boundary edges, the second aperture plate being adapted to block the beam on opposite sides of the second aperture;
   deflection means between said first aperture plate and said second aperture plate for progressively deflecting the beam through the second aperture between beam blocking positions on opposites sides of the second aperture;
   focusing means for focusing the portion of the beam transmitted through said second aperture onto a target plane;
   scanning means between said second aperture plate and the target plane for scanning the portion of the beam transmitted through the second aperture across the target plane; and
   control means controlling the deflection and scanning means to progressively deflect the beam from a first beam blocking position on one side of the second aperture across an edge of the second aperture to a position aligned with the second aperture, to thereafter scan the aligned beam with s substantially constant cross section per scan across a desired portion of the target plane, and to thereafter progressively deflect the beam from a position aligned with the second aperture across an edge of the second aperture to a second beam blocking position on the opposite side of the second aperture from the first beam blocking position, the progressive deflection of the beam across the second aperture edges at each end of the scan providing high scanning edge resolution at the target plane corresponding to the second aperture edges.

2. The apparatus of claim 1 wherein said focusing means is a final lens for focusing the beam on said target plane, and further comprising a collimating lens between said source and said first aperture plate for collimating the beam onto the first aperture plate.

3. The apparatus of claim 2 further including:
   a second lens between said first and second aperture plates for focusing the image of said first aperture plate onto said second aperture plate.

4. The apparatua of claim 1, wherein said control means includes means for terminating the scan at the margin of a feature to be scanned and deflecting the beam out of the area of the feature to be scanned so as to define the margin of the feature to be scanned.

5. The apparatus of claim 1, wherein the deflection means is adapted to offset the beam from the first aperture to an axis which is parallel to but offset from the axis of the second aperture.

6. The apparatus of claim 5, wherein the first and second apertures are axially aligned.

7. The apparatus of claim 5, the deflection means comprising a first set of deflection plates adapted to direct the beam at an angle to the second aperture axis and a second set of deflection plates downstream from the first set and adapted to redirect the beam substantially parallel to the second aperture axis, and the control means varies the deflection angle applied by the first set of deflection plates to the beam.

8. The method of shaping and blanking a focused charged particle beam comprising the steps of:
   generating a beam of charged particles and shaping the beam by passing it through a first aperture;
   providing an aperture plate having a second aperture therein defined by boundary edges;
   initially directing the shaped beam onto the aperture plate adjacent the second aperture so that the plate substantially blocks the beam;

progressively and substantially continuously deflecting the beam across an edge of the second aperture to a position aligned with the aperture;

focusing the portion of the beam transmitted through the second aperture onto a target plane; and scanning the aligned beam with a substantially constant cross section across a desired portion of the target plane;

the progressive deflection of the beam across the edge of the second aperture providing a high edge resolution at the target plane corresponding to said aperture edge.

9. The method of claim 8, wherein the beam is directed onto the aperture plate adjacent the aperture by initially directing it substantially parallel to the aperture axis at an upstream location, then deflecting it at an angle to the aperture axis, and then deflecting it back substantially parallel to the aperture axis, and the beam is progressively deflected across an edge of the aperture by progressively adjusting the deflection angle.

10. The method of claim 9, wherein the beam is first directed substantially along the aperture axis at the upstream location.

11. The method of claim 8, further comprising the step after the completion of a scan of progressively deflecting the beam across a second edge of the aperture to a final position on the opposite side of the aperture from the beam's initial position, the plate substantially blocking the beam at said final position, and the progressive deflection of the beam across the second aperture edge to said final position providing a high edge resolution at the target plane corresponding to the second aperture edge.

12. An apparatus for scanning a focused beam across a target to expose a feature on the target, comprising:

means for generating a beam of charged particles;

a first aperture plate in the beam path, said first aperture plate having a first aperture therein for shaping the beam, a second aperture plate in the beam path, said second aperture plate having a second aperture therein defined by boundary edges, the second plate being adapted to block the beam on a side of the second aperture;

deflection means upstream of the second aperture plate for progressively and substantially continuously deflecting the beam from a blocked position on the second plate to a position at which at least a portion of the beam is transmitted through the second aperture;

focusing means for focusing the portion of the beam transmitted through the second aperture onto a target plane;

scanning means between the second aperture plate and the target plane for scanning the portion of the beam transmitted through the second aperture across the target plane with a substantially constant cross section per scan; and control means controlling the deflection and scanning means to progressively deflect the beam across an edge of the second aperture from a beam blocking position on one side of the second aperture to a position aligned with the second aperture, the progressive beam deflection across said second aperture edge providing high scanning edge resolution at the target plane corresponding to the aperture edge.

13. The apparatus of claim 12, wherein the beam generating means is adapted to generate a substantially collimated beam.

14. The apparatus of claim 13, wherein the beam deflection means is adapted to deflect the beam at an angle to the aperture axis and thereafter to redirect the beam substantially parallel to the aperture axis, and the control means is adapted to vary the deflection angle to vary the total beam deflection.

15. The apparatus of claim 14, the deflection means comprising a first set of deflection plates for deflecting the beam at an angle to the aperture axis, and a second set of deflector plates for redirecting the beam substantially parallel to the aperture axis.

16. The apparatus of claim 14, wherein the beam generating means is adapted to direct the beam substantially along the aperture axis upstream from the deflection means.

* * * * *